United States Patent
Maeda et al.

(10) Patent No.: US 9,859,211 B2
(45) Date of Patent: *Jan. 2, 2018

(54) NONVOLATILE SEMICONDUCTOR MEMORY DEVICE INCLUDING PILLARS BURIED INSIDE THROUGH HOLES

(71) Applicant: TOSHIBA MEMORY CORPORATION, Minato-ku (JP)

(72) Inventors: Takashi Maeda, Kanagawa-ken (JP); Yoshihisa Iwata, Kanagawa-ken (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/190,921

(22) Filed: Jun. 23, 2016

(65) Prior Publication Data

US 2016/0307838 A1 Oct. 20, 2016

Related U.S. Application Data

(63) Continuation of application No. 14/466,620, filed on Aug. 22, 2014, now Pat. No. 9,412,756, which is a
(Continued)

(30) Foreign Application Priority Data

Mar. 26, 2008 (JP) ................... 2008-080526

(51) Int. Cl.
  *H01L 23/528* (2006.01)
  *H01L 27/11551* (2017.01)
  (Continued)

(52) U.S. Cl.
  CPC ........ *H01L 23/528* (2013.01); *H01L 23/5226* (2013.01); *H01L 27/1157* (2013.01);
  (Continued)

(58) Field of Classification Search
  CPC ............... H01L 23/528; H01L 23/5226; H01L 27/11551; H01L 27/11556; H01L 27/1157; H01L 27/11578; H01L 27/11582
  See application file for complete search history.

(56) References Cited

U.S. PATENT DOCUMENTS 9,412,756 B2 * 8/2016 Maeda .............. H01L 27/11551
2007/0252201 A1 11/2007 Kito et al.
(Continued)

FOREIGN PATENT DOCUMENTS

JP  10-223867  8/1998
JP  2001-203286  7/2001
(Continued)

OTHER PUBLICATIONS

Office Action dated Aug. 3, 2010 in Japanese Patent Application No. 2008-080526 filed Mar. 26, 2008 (w/English translation).
(Continued)

*Primary Examiner* — Laura Menz
*Assistant Examiner* — Candice Y Chan
(74) *Attorney, Agent, or Firm* — Oblon, McClelland, Maier & Neustadt, L.L.P.

(57) ABSTRACT

In a nonvolatile semiconductor memory device, a stacked body is formed by alternately stacking dielectric films and conductive films on a silicon substrate and a plurality of through holes extending in the stacking direction are formed in a matrix configuration. A shunt interconnect and a bit interconnect are provided above the stacked body. Conductor pillars are buried inside the through holes arranged in a line immediately below the shunt interconnect out of the plurality of through holes, and semiconductor pillars are buried inside the remaining through holes. The conductive pillars are formed from a metal, or low resistance silicon. Its upper end portion is connected to the shunt interconnect and its lower end portion is connected to a cell source formed in an upper layer portion of the silicon substrate.

7 Claims, 13 Drawing Sheets

Related U.S. Application Data continuation of application No. 13/275,436, filed on Oct. 18, 2011, now Pat. No. 8,853,766, which is a continuation of application No. 12/408,183, filed on Mar. 20, 2009, now Pat. No. 8,084,809.

(51) Int. Cl.

| | | |
|---|---|---|
| H01L 27/11556 | (2017.01) | |
| H01L 27/11578 | (2017.01) | |
| H01L 23/522 | (2006.01) | |
| H01L 27/1157 | (2017.01) | |
| H01L 27/11582 | (2017.01) | |

(52) U.S. Cl.
CPC .. *H01L 27/11551* (2013.01); *H01L 27/11556* (2013.01); *H01L 27/11578* (2013.01); *H01L 27/11582* (2013.01); *H01L 2924/0002* (2013.01)

(56) References Cited

U.S. PATENT DOCUMENTS

| | | |
|---|---|---|
| 2008/0315291 A1 | 12/2008 | Kito et al. |
| 2009/0267128 A1 | 10/2009 | Maejima |

FOREIGN PATENT DOCUMENTS

| | | |
|---|---|---|
| JP | 2007-180389 | 7/2007 |
| JP | 2007-266143 | 10/2007 |

OTHER PUBLICATIONS

H. Tanaka, et al., "Bit Cost Scalable Technology with Punch and Plug Process for Ultra High Density Flash Memory", Symposium on VLSI Technology Digest of Technical Papers, 2007, pp. 14-15.

Yoshiaki Fukuzumi, et al., "Optimal Integration and Characteristics of Vertical Array Devices for Ultra-High Density, Bit-Cost Scalable Flash Memory", IEDM, 2007, pp. 449-452.

* cited by examiner

NONVOLATILE SEMICONDUCTOR MEMORY DEVICE INCLUDING PILLARS BURIED INSIDE THROUGH HOLES

CROSS-REFERENCE TO RELATED APPLICATIONS

This application is a continuation of and claims the benefit of priority from U.S. Ser. No. 14/466,620 filed Aug. 22, 2014, which is a continuation of U.S. Ser. No. 13/275,436 filed Oct. 18, 2011 (now U.S. Pat. No. 8,853,766 issued Oct. 7, 2014), which is a continuation of U.S. Ser. No. 12/408,183 filed Mar. 20, 2009 (now U.S. Pat. No. 8,084,809 issued Dec. 27, 2011), which claims the benefit of priority from Japanese Patent Application No. 2008-080526 filed Mar. 26, 2008; the entire contents of each of which are incorporated herein by reference.

BACKGROUND OF THE INVENTION

Field of the Invention

This invention relates to a nonvolatile semiconductor memory device with a plurality of dielectric films and electrode films alternately stacked on a substrate, and a method for manufacturing the same.

Background Art

Recently, to increase the density of flash memory, a technique for multilayering cells has been developed. In this technique, dielectric films and electrode films are alternately stacked on a substrate, and then through holes are simultaneously formed therein. A charge storage layer for retaining charge is formed on the inner surface of the through holes, and a columnar semiconductor pillar is buried inside each through hole. Thus, a memory cell is formed at each intersection between the semiconductor pillar and the electrode film. Then, the uppermost electrode film is divided into a plurality of select gate lines extending in one direction, and a plurality of bit lines extending in another direction are provided above the electrode film and connected to the upper end portion of the semiconductor pillars, so that any of the semiconductor pillars can be selected. On the other hand, a diffusion region is formed in an upper portion of the substrate to serve as a source electrode connected to the lower end of the semiconductor pillars. Thus, a flash memory with memory cells three-dimensionally stacked can be fabricated (see, e.g., JP-A-2007-266143(Kokai)).

However, in such a stacked flash memory, the conductive portions are three-dimensionally arranged. Hence, the conductive portions located other than in the uppermost interconnect layer, such as the diffusion region constituting the source electrode and the electrode film constituting the select gate line and the word line, can be supplied with an electric potential only through the respective end portions thereof. Thus, if the area of the stacked flash memory is increased to increase the capacity, the aforementioned conductive portions are also upsized, unfortunately increasing the resistance. This makes it difficult to rapidly place each conductive portion at a desired potential, which results in increased time required for data write, read, and erase operation, and may cause malfunctions. On the other hand, to avoid upsizing of the conductive portions, division into a plurality of memory cell arrays may be contemplated. However, in this case, each memory cell array requires a row decoder and other circuits, which increases the chip area.

SUMMARY OF THE INVENTION

According to an aspect of the invention, there is provided a nonvolatile semiconductor memory device including: a substrate; a semiconductor region formed in an upper portion of the substrate; a plurality of dielectric films and electrode films which are alternately stacked on the substrate and have a plurality of through holes extending in the stacking direction and formed in a matrix configuration as viewed along the stacking direction; conductor pillars buried inside a subset of the plurality of through holes, the through holes in the subset being arranged in a first direction; semiconductor pillars buried inside the remaining through holes and connected to the semiconductor region; a shunt interconnect provided above the plurality of dielectric films and electrode films and connected to the conductor pillars; a bit interconnect provided above the plurality of dielectric films and electrode films and connected to the semiconductor pillars; and a charge storage layer provided at least between the semiconductor pillar and some of the electrode films, the conductor pillar having a lower resistivity than the semiconductor pillar.

According to another aspect of the invention, there is provided a method for manufacturing a nonvolatile semiconductor memory device, including: doping an upper portion of a substrate with impurities to form a semiconductor region; forming one dielectric film and one electrode film on the substrate to form a lower stacked body; forming lower through holes in the lower stacked body in a matrix configuration; forming a gate dielectric film on an inner surface of the lower through holes; burying a semiconductor material inside the lower through holes; alternately stacking a plurality of dielectric films and a plurality of electrode films on the lower stacked body to form an intermediate stacked body; forming intermediate through holes in the intermediate stacked body immediately above the lower through holes; forming a charge storage layer on an inner surface of the intermediate through holes; burying a semiconductor material inside the intermediate through holes; forming one dielectric film, one electrode film, and one dielectric film in this order on the intermediate stacked body to form an upper stacked body; forming upper through holes in the upper stacked body immediately above the intermediate through holes; forming a gate dielectric film on an inner surface of the upper through holes; burying a semiconductor material inside the upper through holes to form semiconductor pillars inside through holes made of the lower through holes, the intermediate through holes, and the upper through holes communicating with each other; removing the semiconductor pillars from inside a subset of the through holes, the through holes in the subset being arranged in a first direction; forming conductor pillars by burying a conductor material inside the through holes from which the semiconductor pillars have been removed; and forming a shunt interconnect and a bit interconnect on the upper stacked body, the shunt interconnect being connected to the conductor pillars and the bit interconnect being connected to the semiconductor pillars.

DETAILED DESCRIPTION OF THE INVENTION

Embodiments of the invention will now be described with reference to the drawings.

At the outset, a first embodiment of the invention is described.

Figure 1:
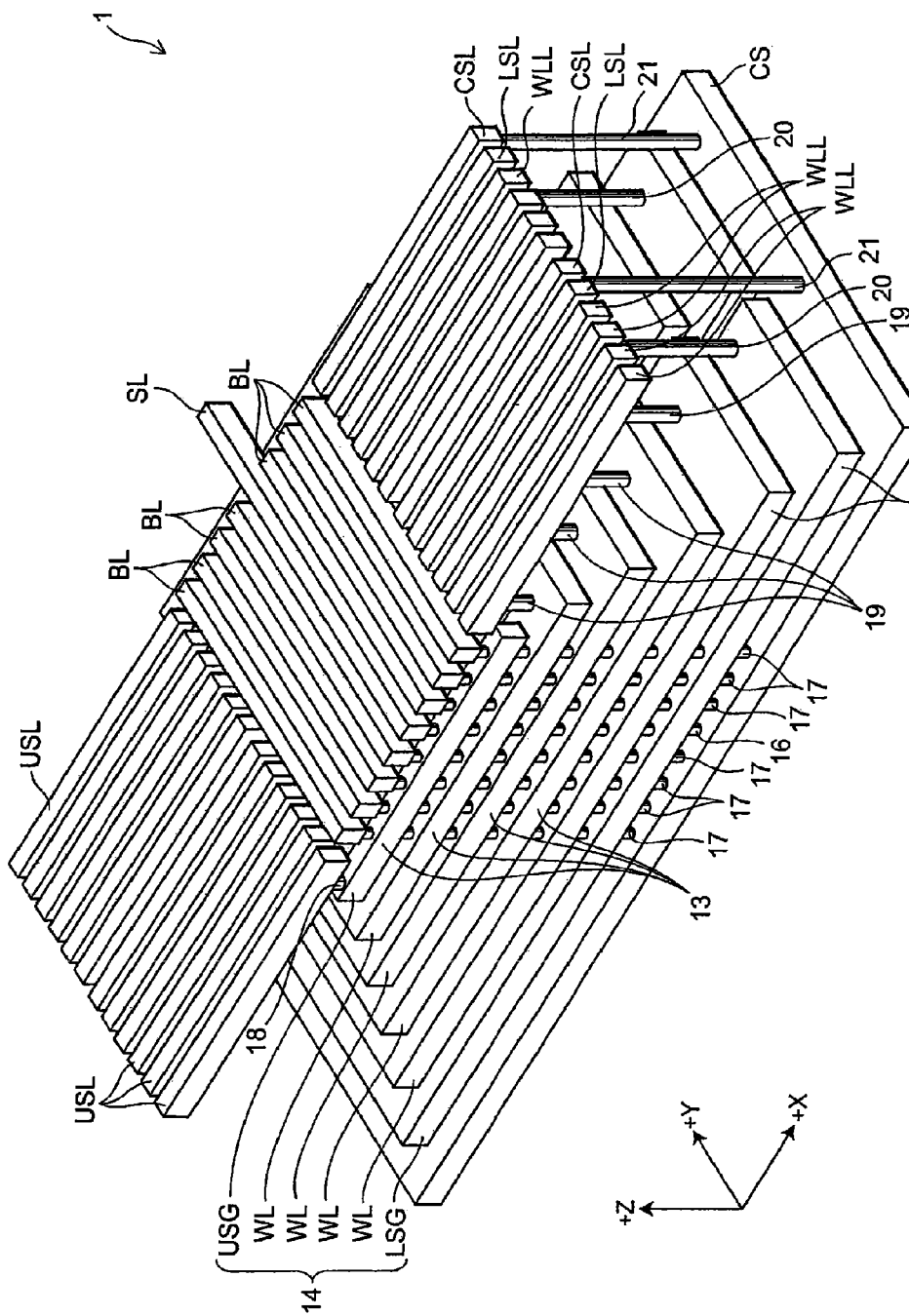
FIG. 1 is a perspective view illustrating a nonvolatile semiconductor memory device according to a first embodiment of the invention.

FIG. 1 is a perspective view illustrating a nonvolatile semiconductor memory device according to this embodiment.

Figure 2:
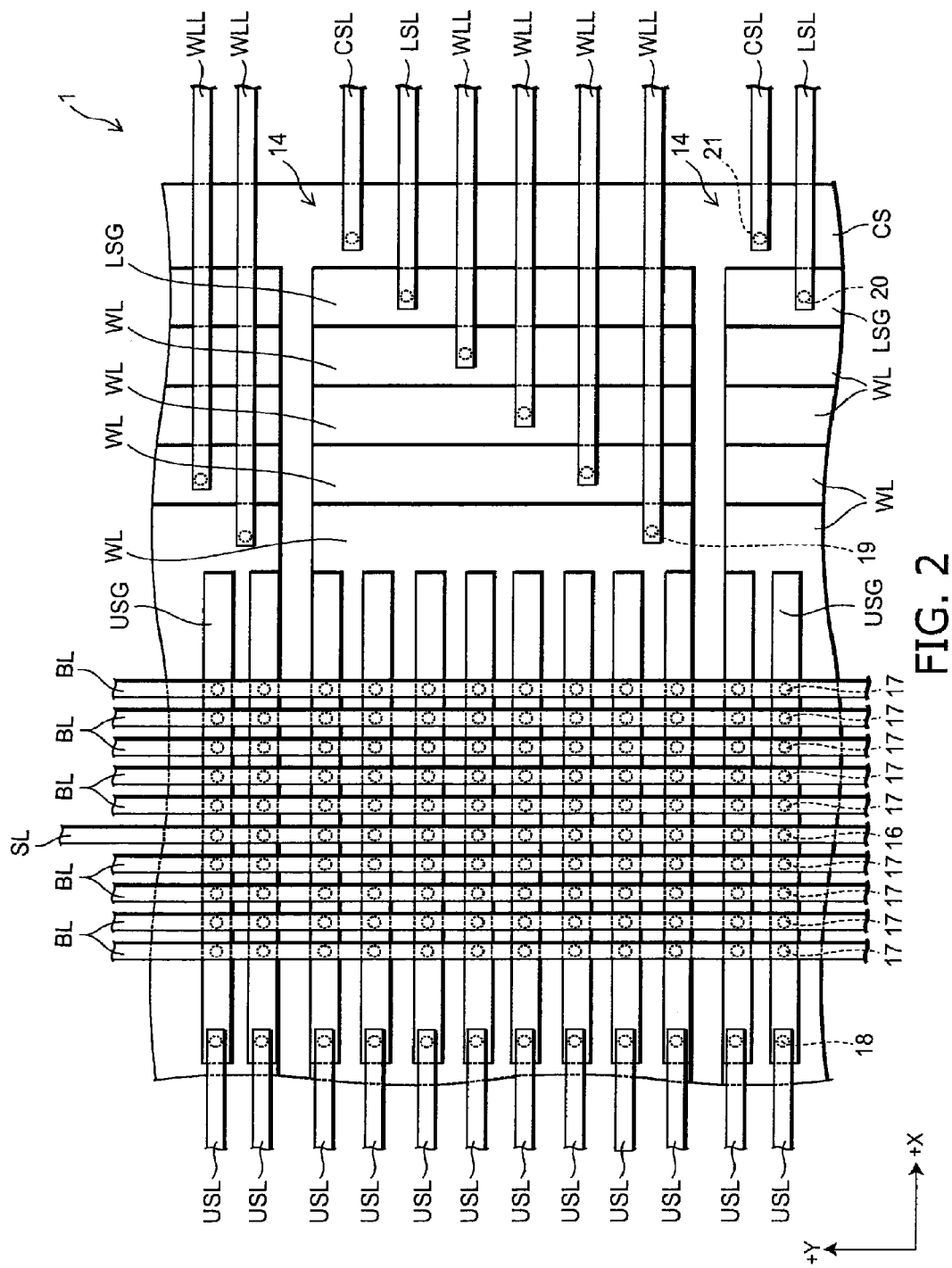
FIG. 2 is a plan view illustrating the nonvolatile semiconductor memory device according to the first embodiment.

FIG. 2 is a plan view illustrating the nonvolatile semiconductor memory device according to this embodiment.

Figure 3:
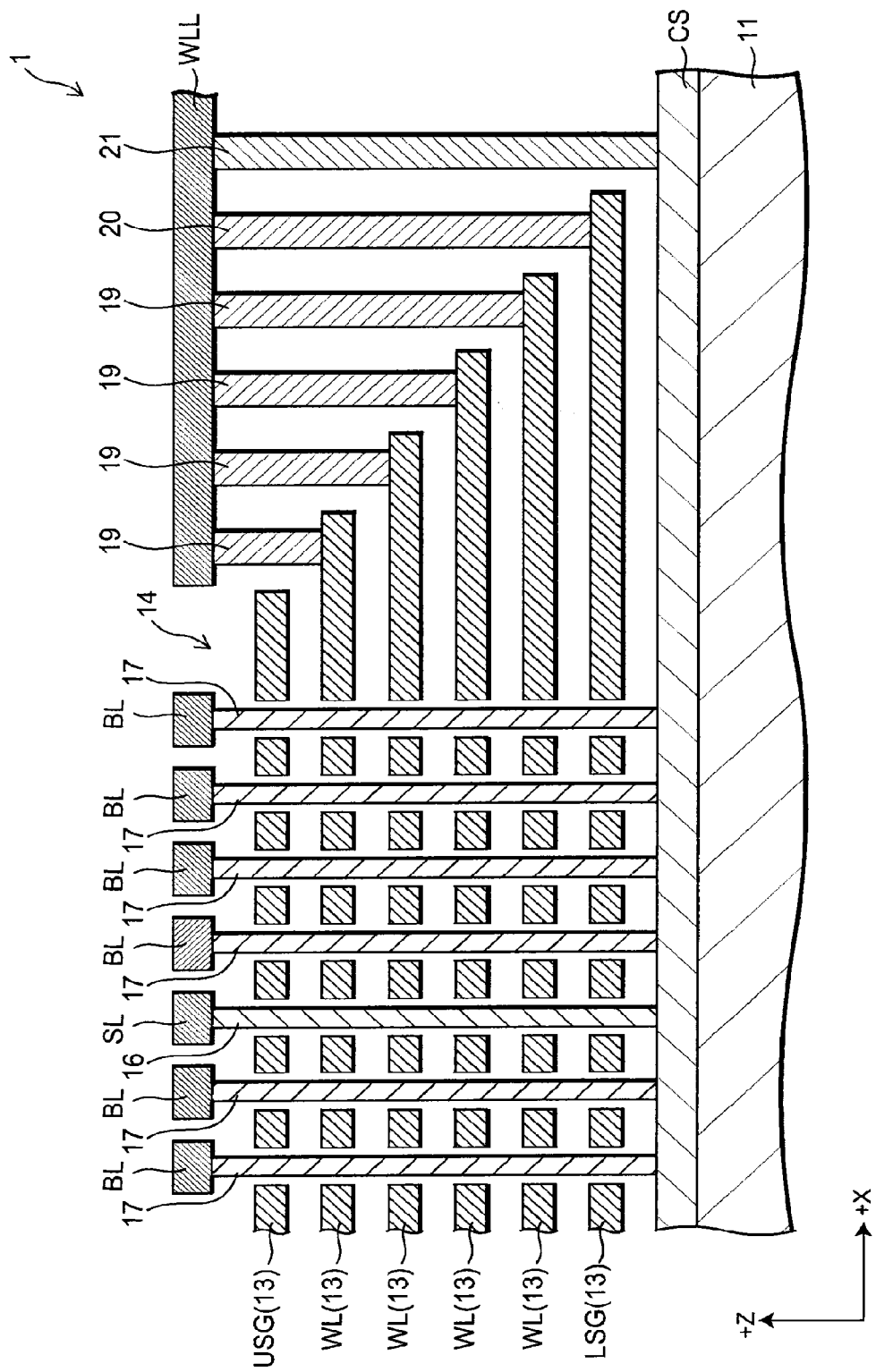
FIG. 3 is a cross-sectional view illustrating the nonvolatile semiconductor memory device according to the first embodiment.

FIG. 3 is a cross-sectional view illustrating the nonvolatile semiconductor memory device according to this embodiment.

Figure 4:
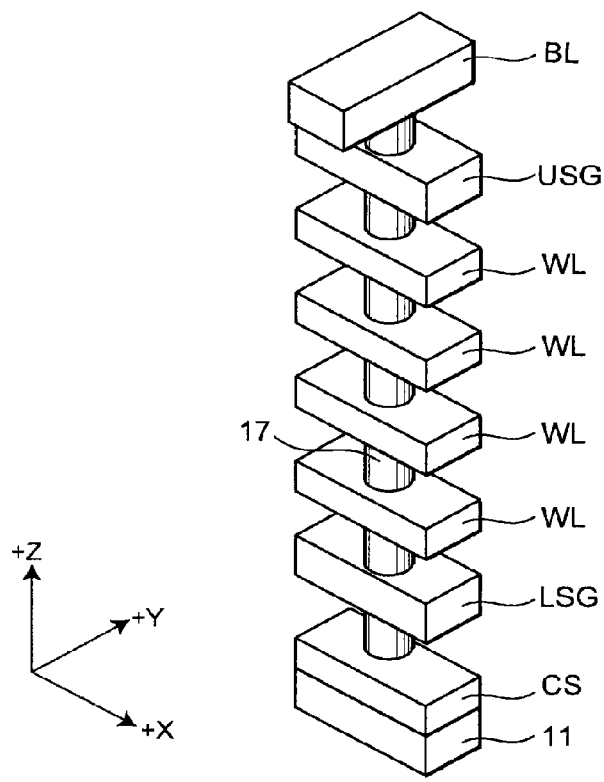
FIG. 4 is a perspective view illustrating one memory string in the nonvolatile semiconductor memory device according to the first embodiment.

FIG. 4 is a perspective view illustrating one memory string in the nonvolatile semiconductor memory device according to this embodiment.

Figure 5:
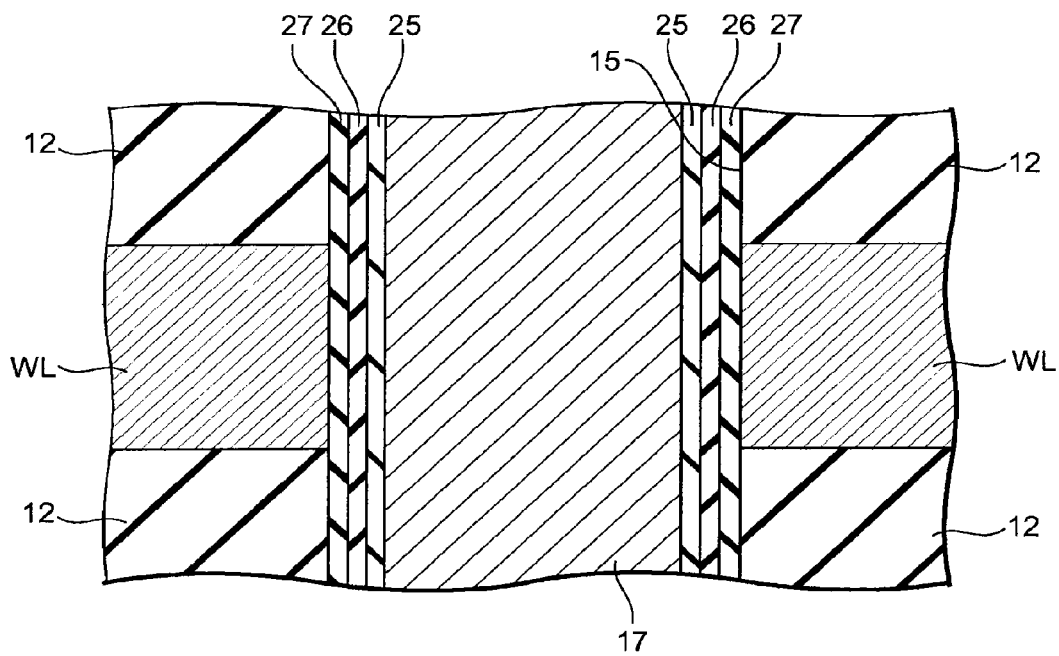
FIG. 5 is a cross-sectional view illustrating one memory cell in the nonvolatile semiconductor memory device according to the first embodiment.

FIG. 5 is a cross-sectional view illustrating one memory cell in the nonvolatile semiconductor memory device according to this embodiment.

It is noted that in FIGS. 1 to 4, for clarity of illustration, only the conductive portions are shown, and the dielectric portions are not shown. Furthermore, in FIGS. 1 and 2, illustration of the silicon substrate 11 is also omitted. Similarly, in the other embodiments described later, the figures are simplified as appropriate.

As shown in FIGS. 1 to 3, the nonvolatile semiconductor memory device 1 (hereinafter also simply referred to as "device 1") according to this embodiment includes a silicon substrate 11 illustratively made of single crystal silicon. One memory cell array is provided in an upper portion of the silicon substrate 11 and thereabove. A rectangular region in the upper portion of the silicon substrate 11 is doped with impurities to form a semiconductor region serving as a cell source CS. On the silicon substrate 11 immediately above the cell source CS, a plurality of dielectric films 12 (see FIG. 5) illustratively made of silicon oxide ($SiO_2$) and a plurality of electrode films 13 illustratively made of polycrystalline silicon are alternately stacked to form a stacked body 14. The thickness of the electrode film 13 is illustratively 50 nanometers (nm) or more, and the number of stacked layers is illustratively six.

In the following, for convenience of description, an XYZ orthogonal coordinate system is herein introduced. In this coordinate system, the two directions parallel to the upper surface of the silicon substrate 11 and orthogonal to each other are referred to as the X and Y direction, and the direction orthogonal to both the X and Y direction is referred to as the Z direction.

The X-direction length of the electrode films 13 becomes shorter toward the upside. As viewed from above (+Z direction), each electrode film 13 is located inside the electrode films 13 and the cell source CS located therebelow. On the other hand, the electrode films 13 have the same Y-direction length. Dielectric films (not shown) are provided in the ±X and ±Y direction as viewed from the electrode film 13. The lowermost electrode film 13 serves as a lower select gate LSG, the uppermost electrode film 13 serves as an upper select gate USG, and the other electrode films 13 serve as word lines WL. As described above, the number of stacked electrode films 13 is illustratively six. Hence, sequentially from the top, the electrode films 13 serve as an upper select gate USG, four word lines WL, and a lower select gate LSG. The stacked body 14 is provided in a plurality along the Y direction.

The upper select gate USG is divided along the Y direction into a plurality of interconnecting conductive members extending in the X direction. On the other hand, the word line WL and the lower select gate LSG are not divided in the individual stacked body 14, but are each formed into one plate-like conductive member parallel to the XY plane. In this embodiment, the cell source CS is also not divided, but is formed into one plate-like conductive member constituting the XY plane so as to connect the immediately underlying regions of the plurality of stacked bodies 14.

Each dielectric film 12 and each electrode film 13 include a plurality of through holes 15 extending in the stacking direction (Z direction). The through holes 15 are arranged in a matrix configuration along the X and Y direction, and the arrangement period of the through holes 15 is constant in each of the X and Y direction. Each through hole 15 penetrates entirely through the stacked body 14. In each upper select gate USG, a plurality of through holes 15 are arranged in a line along the X direction.

Conductor pillars 16 are buried in a subset of the plurality of through holes 15 arranged in a line in the Y direction. The conductor pillar 16 is formed from a metal such as tungsten (W) or aluminum (Al), or a semiconductor highly doped with impurities such as polycrystalline silicon or amorphous silicon. It is noted that the term "metal" used herein includes alloys as well as pure metals.

On the other hand, semiconductor pillars 17 are buried in the remaining through holes 15. The semiconductor pillar 17 is formed from a semiconductor doped with impurities such as polycrystalline silicon or amorphous silicon. The conductor pillar 16 has the same cylindrical shape as the semiconductor pillar 17, both extending in the Z direction.

In this embodiment, the lower end portions of the conductor pillar 16 and the semiconductor pillar 17 are both connected to the cell source CS.

By way of example, the conductor pillars 16 are located in the vicinity of the X-direction center portion in the matrix composed of the conductor pillars 16 and the semiconductor pillars 17. However, the invention is not limited thereto. For example, the conductor pillars 16 may be located at the −X-direction end portion of the matrix composed of the conductor pillars 16 and the semiconductor pillars 17.

A plurality of bit interconnects BL extending in the Y direction are provided immediately above the region including the upper select gate USG. Furthermore, one shunt interconnect SL, for example, is mixed with the bit interconnects BL. The bit interconnects BL and the shunt interconnect SL are located at an equal height and formed from a metal such as tungsten, aluminum, or copper (Cu). The shunt interconnect SL is provided immediately above the conductor pillars 16 and connected to the upper end portion of each conductor pillar 16. On the other hand, the bit interconnects BL are provided immediately above the semiconductor pillars 17, and each bit interconnect BL is connected to the upper end portion of each column of the semiconductor pillars 17 arranged along the Y direction. That is, the semiconductor pillars 17 in different columns extending in the Y direction are connected to different bit interconnects BL. In this embodiment, the bit interconnects BL and the shunt interconnect SL are continuously disposed so as to extend immediately above the plurality of stacked bodies 14 arranged in the Y direction, and commonly connected to the semiconductor pillars 17 and the conductor pillars 16 in the respective stacked bodies 14.

As described above, the conductor pillar 16 and the semiconductor pillar 17 have the same shape, and the lower end portions thereof are both connected to the cell source CS. However, these pillars have different functions. The conductor pillar 16 serves as a connecting member for connecting the shunt interconnect SL to the cell source CS. On the other hand, the semiconductor pillar 17 serves as a semiconductor region of the transistor constituting a memory cell in the portion where the semiconductor pillar 17 penetrates through the word line WL. Hence, the conductor pillar 16 has a lower resistivity than the semiconductor pillar 17.

A plurality of upper select gate interconnects USL extending in the X direction are provided on the −X-direction side of the region including the bit interconnects BL and the shunt interconnect SL. The upper select gate interconnect USL is formed from a metal such as tungsten, aluminum, or copper. The number of upper select gate interconnects USL is the same as the upper select gates USG, and each upper select gate interconnect USL is connected to a corresponding one of the upper select gates USG through a via 18.

Furthermore, on the +X-direction side of the region including the bit interconnects BL and the shunt interconnect SL, for each stacked body 14, a plurality of word interconnects WLL extending in the X direction, one lower select gate interconnect LSL extending in the X direction, and one cell source interconnect CSL extending in the X direction are provided. The word interconnect WLL, the lower select gate interconnect LSL, and the cell source interconnect CSL are formed from a metal such as tungsten, aluminum, or copper. The number of word interconnects WLL for each stacked body 14 is the same as the number of word lines WL, and each word interconnect WLL is connected to a corresponding one of the word lines WL through a via 19. The lower select gate interconnect LSL is connected to the lower select gate LSG through a via 20, and the cell source interconnect CSL is connected to the cell source CS through a contact 21. The vias 19, 20 and the contact 21 are formed in a region immediately above the electrode film 13 to which they are connected, the region lying on the +X-direction side out of the overlying electrode film 13.

The bit interconnect BL, the shunt interconnect SL, the upper select gate interconnect USL, the word interconnect WLL, the lower select gate interconnect LSL, and the cell source interconnect CSL are identical in the position along the height (Z direction), thickness, and material, and illustratively formed by patterning one metal film. The interconnects are insulated from each other by an interlayer dielectric film (not shown).

As shown in FIG. 4, each semiconductor pillar 17 is connected between a bit interconnect BL and the cell source CS, and penetrates through an upper select gate USG, a plurality of word lines WL, and the lower select gate LSG from above to below, that is, from the junction with the bit interconnect BL toward the junction with the cell source CS.

As shown in FIG. 5, in the cylindrical portion between the semiconductor pillar 17 and the word line WL, a dielectric layer 25, a charge storage layer 26, and a dielectric layer 27 are laminated in this order from the inside, that is, from the semiconductor pillar 17 side. The dielectric layers 25 and 27 are illustratively made of silicon oxide ($SiO_2$), and the charge storage layer 26 is illustratively made of silicon nitride (SiN). Thus, an SGT (surrounding gate transistor) serving as a memory cell is formed at the intersection between the semiconductor pillar 17 and the word line WL, and charge is stored in the portion of the charge storage layer 26 located in the SGT. Thus, as many memory cells as the word lines WL are arranged in a line in the Z direction along one semiconductor pillar 17 and therearound to constitute one memory string. In the device 1, a plurality of semiconductor pillars 17 are arranged in a matrix configuration along the X and Y direction. Hence, a plurality of memory cells are three-dimensionally arranged along the X, Y, and Z direction.

On the other hand, in the cylindrical portion between the semiconductor pillar 17 and the upper select gate USG and between the semiconductor pillar 17 and the lower select gate LSG, a gate dielectric film (not shown) is provided. Thus, SGTs are formed also at the intersection between the semiconductor pillar 17 and the upper select gate USG and at the intersection between the semiconductor pillar 17 and the lower select gate LSG, respectively. These SGTs do not serve as memory cells, but serve to select the semiconductor pillar 17.

Likewise, also in the cylindrical portion between the conductor pillar 16 and the word line WL, a dielectric layer 25, a charge storage layer 26, and a dielectric layer 27 are laminated in this order. Thus, the conductor pillar 16 is insulated from the electrode film 13, that is, from the upper select gate USG, the word line WL, and the lower select gate LSG, but connected only to the shunt interconnect SL and the cell source CS. Here, at least one of the dielectric layers 25 and 27 only needs to be provided around the conductor pillar 16, and the charge storage layer 26 may be omitted. Furthermore, a gate dielectric film (not shown) is provided between the conductor pillar 16 and the upper select gate USG and between the conductor pillar 16 and the lower select gate LSG. Thus, the charge storage layer 26 only needs to be provided at least between the semiconductor pillar 17 and part of the electrode film 13, that is, in the portion constituting the memory cell.

The device 1 further includes a driver circuit for applying a potential to the upper end portion of the semiconductor pillar 17 through the bit interconnect BL, a driver circuit for applying a potential to the lower end portion of the semiconductor pillar 17 through the cell source CS, a driver circuit for applying a potential to the upper select gate USG through the upper select gate interconnect USL, a driver circuit for applying a potential to the lower select gate LSG through the lower select gate interconnect LSL, and a driver circuit for applying a potential to each word line WL through the word interconnect WLL (all the driver circuits being not shown).

Next, an example method for manufacturing the device 1 according to this embodiment is described.

First, a rectangular region in an upper portion of a silicon substrate 11 is doped with impurities to form a cell source CS. Next, one dielectric film 12 and one electrode film 13 are formed on the silicon substrate 11. Then, through holes are formed in the lower stacked body composed of these electrode film 13 and dielectric film 12. Here, for example, the through holes are simultaneously formed in a matrix configuration in the region where conductor pillars 16 are to be formed and the region where semiconductor pillars 17 are to be formed in the later process. Next, a gate dielectric film is formed on the inner surface of the through hole, and a semiconductor material, such as N-type polycrystalline silicon or amorphous silicon doped with donors, is buried in the through holes. Thus, a lower select gate LSG, the lower portion of the through holes 15, and the lower portion of the semiconductor pillars 17 are formed.

Next, a plurality of, e.g. four dielectric films 12 and e.g. four electrode films 13 are alternately stacked to form an intermediate stacked body. Then, through holes are formed in the intermediate stacked body composed of the stacked electrode films 13 and dielectric films 12. Here again, for example, the through holes to be buried with conductor pillars 16 and the through holes to be buried with semiconductor pillars 17 in the later process are simultaneously formed in a matrix configuration. That is, new through holes are formed immediately above the previously formed through holes. Next, a dielectric layer 27, a charge storage layer 26, and a dielectric layer 25 are formed in this order on the inner surface of the through hole. Next, a semiconductor material, such as N-type polycrystalline silicon or amorphous silicon doped with donors, is buried in all the through holes. Thus, the four electrode films 13 serve as word lines WL, and the center portion of the through holes 15 and the center portion of the semiconductor pillars 17 are formed.

Next, one dielectric film 12, one electrode film 13, and one dielectric film 12 are formed in this order to form an upper stacked body. Then, new through holes are formed in the upper stacked body immediately above the through holes formed in the intermediate stacked body. Next, a gate dielectric film is formed on the inner surface of the through hole, and a semiconductor material is buried therein. Thus, the formed electrode film 13 serves as an upper select gate USG, and the upper portion of the through holes 15 and the upper portion of the semiconductor pillars 17 are formed. Thus, the lower portion, the center portion, and the upper portion of the through hole 15 communicate with each other to form one through hole 15. Furthermore, the lower portion, the center portion, and the upper portion of the semiconductor pillar 17 are connected to each other to form one semiconductor pillar 17. Consequently, the through holes 15 and the semiconductor pillars 17 are completed.

Then, a resist film (not shown) is formed so as to expose only the through holes 15 to be buried with conductor pillars 16 while covering the other through holes 15. This resist film is used as a mask to perform etching, thereby removing the semiconductor pillars 17 from inside the through holes 15 to be buried with conductor pillars 16. Subsequently, a conductor material, such as $N^+$-type polycrystalline silicon or amorphous silicon doped with donors at a higher concentration than the conductor pillar 16, or a metal such as tungsten or aluminum, is newly buried in these through holes 15 to form conductor pillars 16.

Then, vias 19, 20 and a contact 21 are formed. Next, a metal film is formed on the entire surface and patterned into bit interconnects BL, a shunt interconnect SL, upper select gate interconnects USL, word interconnects WLL, a lower select gate interconnect LSL, and a cell source interconnect CSL. Thus, the device 1 is manufactured. According to this method, the through holes 15 arranged with a constant period in each of the X and Y direction are simultaneously formed. Hence, the variation in the size of the through holes 15 can be reduced.

Alternatively, the device 1 can be manufactured also by the following method.

In each of the aforementioned steps of forming through holes 15, a resist film (not shown) is formed to cover the region where conductor pillars 16 are to be formed while exposing the region where semiconductor pillars 17 are to be formed. This resist film is used as a mask to perform etching so that only the through holes 15 to be buried with semiconductor pillars 17 are formed first. Then, a semiconductor material is buried in these through holes 15 to form semiconductor pillars 17. Next, the stacked body 14 is formed, after that through holes 15 are formed in the region to be buried with conductors 16, and a conductive material is buried therein to form conductor pillars 16. Subsequently, likewise, vias 19, 20 and a contact 21 are formed, and bit interconnects BL, a shunt interconnect SL, upper select gate interconnects USL, word interconnects WLL, a lower select gate interconnect LSL, and a cell source interconnect CSL are formed.

Next, the operation and effect of this embodiment are described.

As shown in FIG. 1, in the device 1, the X coordinate of a memory cell is selected by selecting a bit line BL, the Y coordinate of the memory cell is selected by selecting an upper select gate USG, and the Z coordinate of the memory cell is selected by selecting a word line WL. Thus, one memory cell is selected from the device 1, and data is stored or erased by charge injection into or extraction from this memory cell. Furthermore, the stored data is read by passing a sense current between the bit line BL and the cell source CS so that the sense current flows through this memory cell.

In this embodiment, the shunt interconnect SL is connected to the cell source CS through the conductor pillar 16. Hence, the potential applied to the shunt interconnect SL can be applied to the cell source CS. Thus, when the potential of the cell source CS is adjusted to a prescribed potential, the potential can be applied to the +X-direction end portion of the cell source CS through the cell source interconnect CSL and the contact 21, and also to the X-direction center portion of the cell source CS through the shunt interconnect SL and the conductor pillar 16. Consequently, even if the device 1 is upsized, the cell source CS can be rapidly charged/discharged, and its potential can be rapidly adjusted to a prescribed potential. This can reduce the time required for data write, read, and erase operation, and avoid malfunctions. Hence, there is no need to provide a plurality of small memory cell arrays to increase the memory capacity of the device 1, and one large memory cell array can be formed.

Thus, there is no need to provide a plurality of sets of peripheral circuits, and the chip area can be reduced.

In contrast, if the shunt interconnect SL and the conductor pillar 16 are not provided, the potential can be applied only through the end portion of the cell source CS when the potential of the cell source CS is adjusted to a prescribed potential. Furthermore, because the cell source CS is an impurity diffusion layer formed in the upper portion of the silicon substrate 11, it has a higher resistivity than the metal portion. Hence, the time required for adjusting the potential of the cell source CS to a prescribed potential is longer than in the case where the shunt interconnect SL and the conductor pillar 16 are provided. Thus, if the memory cell array is upsized, the time required for each operation increases, and malfunctions are more likely to occur. Hence, to increase the capacity of the device 1, a plurality of small memory cell arrays are needed. This results in increased peripheral circuits and chip area.

Furthermore, according to this embodiment, of the through holes 15 arranged in a matrix configuration, conductor pillars 16 are buried in one column of the through holes 15 located at the X-direction center portion. Hence, the conductor pillars 16 can be connected to the X-direction center portion of the cell source CS.

Next, a second embodiment of the invention is described.

Figure 6:
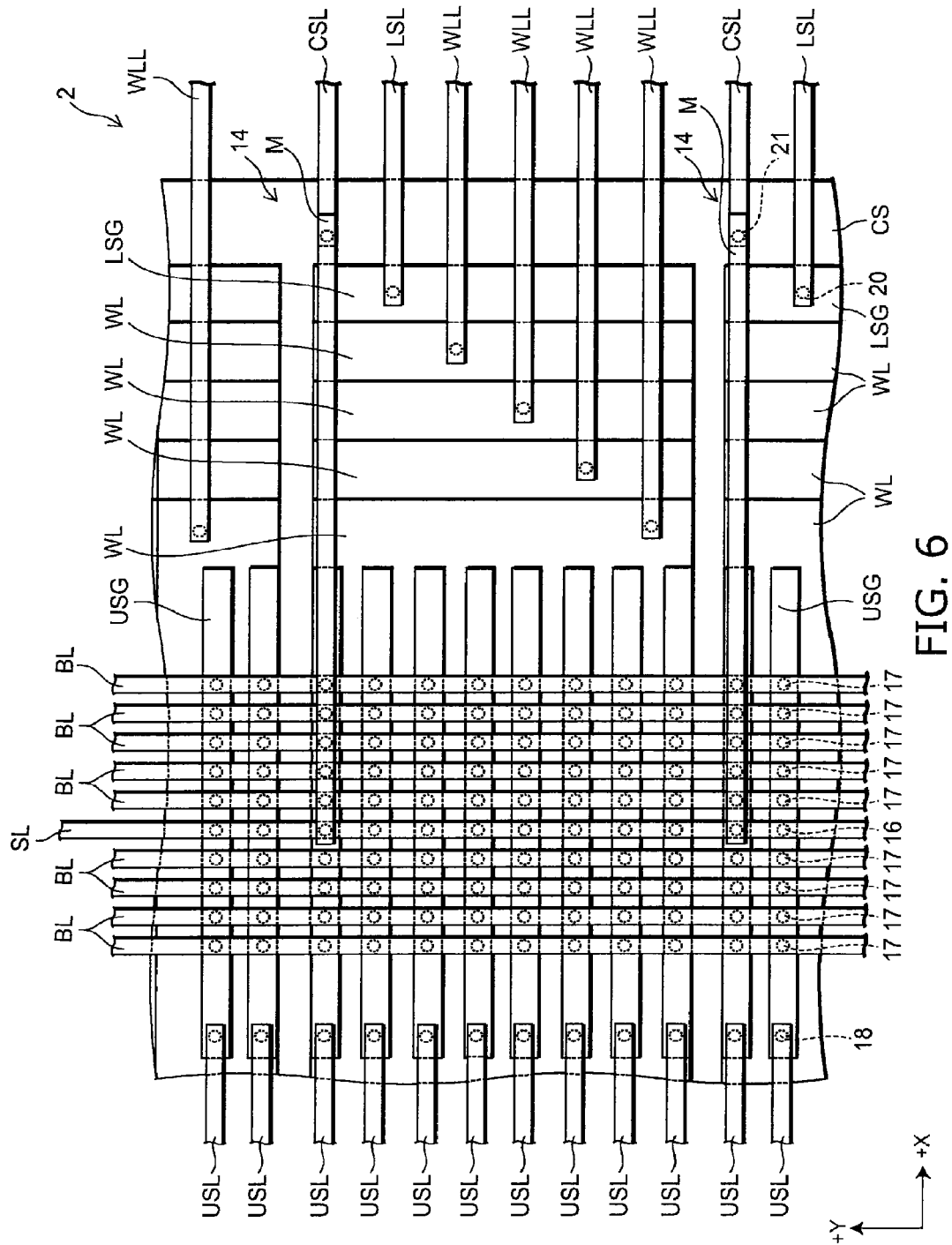
FIG. 6 is a plan view illustrating a nonvolatile semiconductor memory device according to a second embodiment of the invention.

FIG. 6 is a plan view illustrating a nonvolatile semiconductor memory device according to this embodiment.

Figure 7:
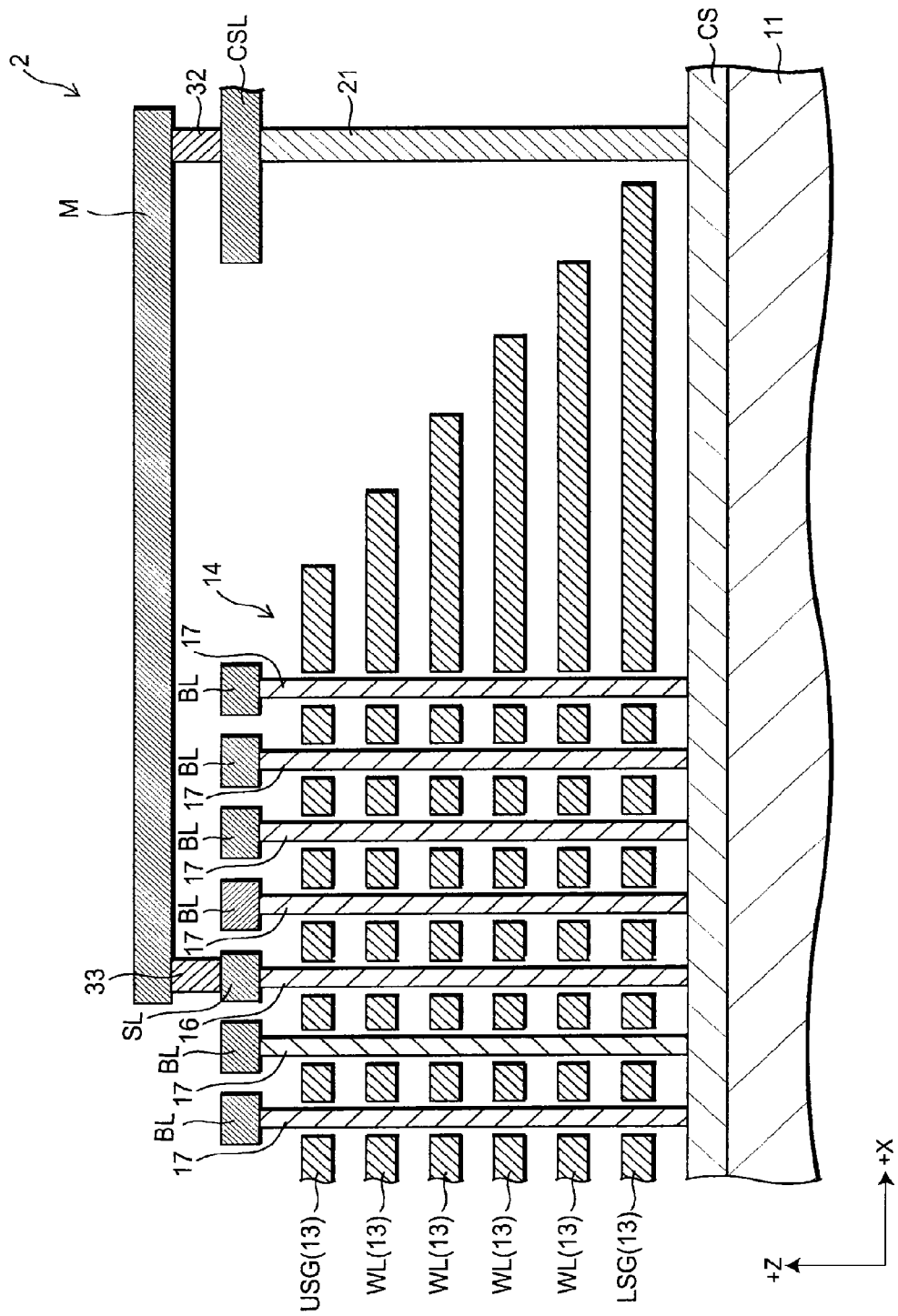
FIG. 7 is a cross-sectional view illustrating the nonvolatile semiconductor memory device according to the second embodiment.

FIG. 7 is a cross-sectional view illustrating the nonvolatile semiconductor memory device according to this embodiment.

As shown in FIGS. 6 and 7, in the nonvolatile semiconductor memory device 2 according to this embodiment, an upper interconnect M extending in the X direction is provided above the shunt interconnect SL. The upper interconnect M is disposed for each stacked body 14 from immediately above the cell source interconnect CSL to immediately above the shunt interconnect SL. The +X-direction end portion of the upper interconnect M is connected to the cell source interconnect CSL through a via 32, and the −X-direction end portion is connected to the shunt interconnect SL through a via 33. The upper interconnect M is formed from a metal such as tungsten, aluminum, or copper. The configuration in this embodiment other than the foregoing is the same as that in the above first embodiment.

To apply a potential to the cell source CS, a driver circuit for the cell source is needed. In the above first embodiment, to apply a potential to the cell source CS through both the contact 21 and the shunt interconnect SL, it is necessary to provide driver circuits for the cell source in both of a region on the +X-direction side and a region on the +Y-direction or −Y-direction side of the stacked body 14, or to provide a drive circuit only in a region on the +X-direction side of the stacked body 14 and route an interconnect from this driver circuit to a region on the +Y-direction or −Y-direction side.

In contrast, according to this embodiment, by providing an upper interconnect M extending in the X direction above the shunt interconnect SL, the cell source interconnect CSL can be connected to the shunt interconnect SL through the upper interconnect M. Hence, there is no need to provide a driver circuit in a region on the Y-direction side of the stacked body 14, and there is also no need to route an interconnect. Thus, the overall configuration of the device can be simplified, and the device can be further downsized. The operation and effect in this embodiment other than the foregoing are the same as those in the above first embodiment.

Next, a third embodiment of the invention is described.

Figure 8:
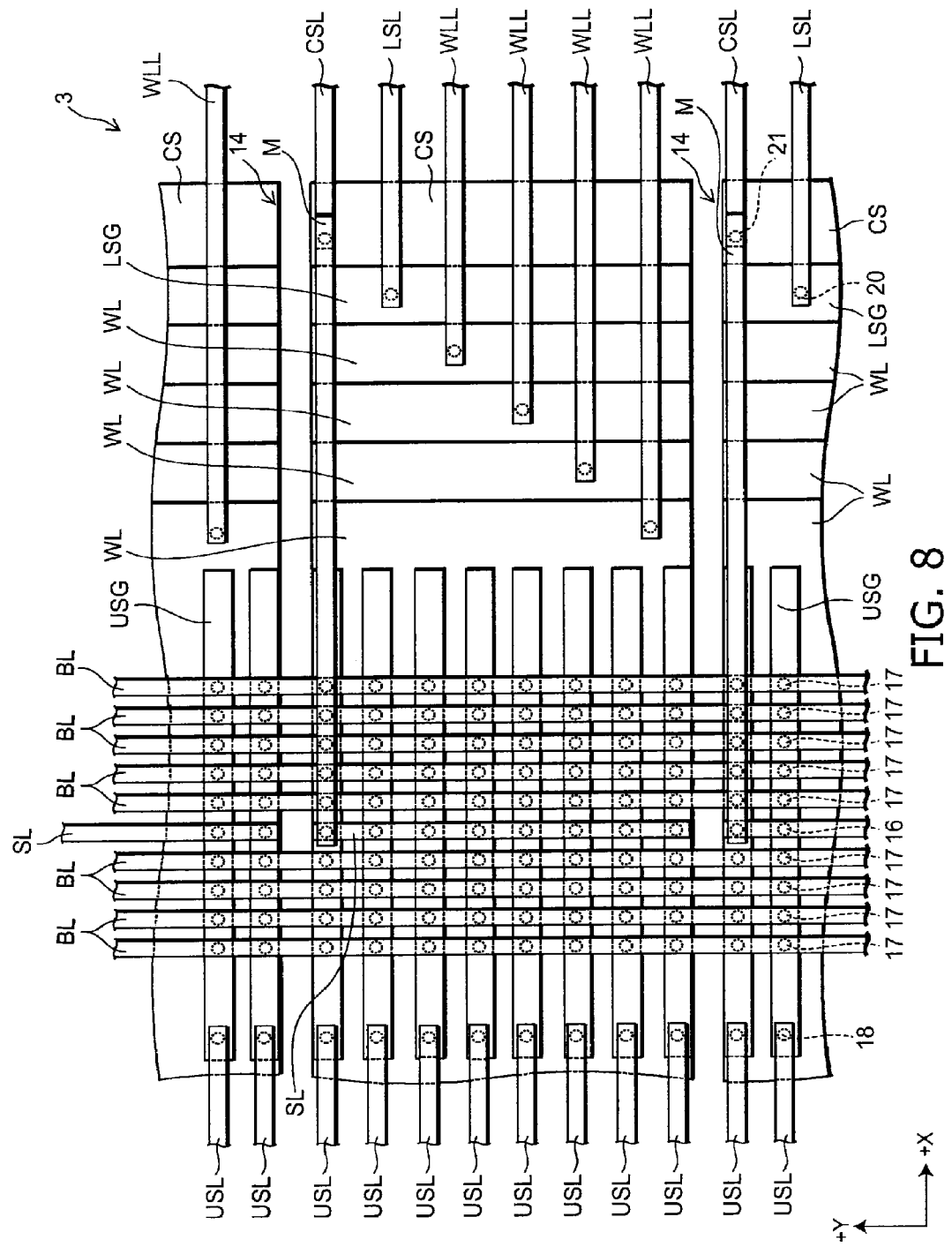
FIG. 8 is a plan view illustrating a nonvolatile semiconductor memory device according to a third embodiment of the invention.

FIG. 8 is a plan view illustrating a nonvolatile semiconductor memory device according to this embodiment.

As shown in FIG. 8, in the nonvolatile semiconductor memory device 3 according to this embodiment, the shunt interconnect SL is divided for each stacked body 14. Furthermore, the upper interconnect M is provided for each stacked body 14. Hence, the device 3 includes as many upper interconnects M as the stacked bodies 14. Moreover, the cell source CS is also divided for each stacked body 14 into a plurality of portions along the Y direction. The plurality of portions of the cell source CS are arranged along the Y direction, and electrically isolated from each other. In each stacked body 14, the upper interconnect M is connected to the corresponding portion of the cell source CS through the shunt interconnect SL and the conductor pillar 16. The configuration in this embodiment other than the foregoing is the same as that in the above second embodiment.

In this embodiment, the shunt interconnect SL and the cell source CS are divided for each stacked body 14, and the upper interconnect M is provided for each stacked body 14. Hence, the voltage applied between the upper and lower end of the semiconductor pillar 17 can be controlled for each stacked body 14. Thus, the data stored in the memory cell can be erased for each stacked body 14. That is, in the device 3, a prescribed number of memory cells in one stacked body 14 constitute one block, and data erasure can be performed for each block. The operation and effect in this embodiment other than the foregoing are the same as those in the above second embodiment.

Next, a fourth embodiment of the invention is described.

Figure 9:
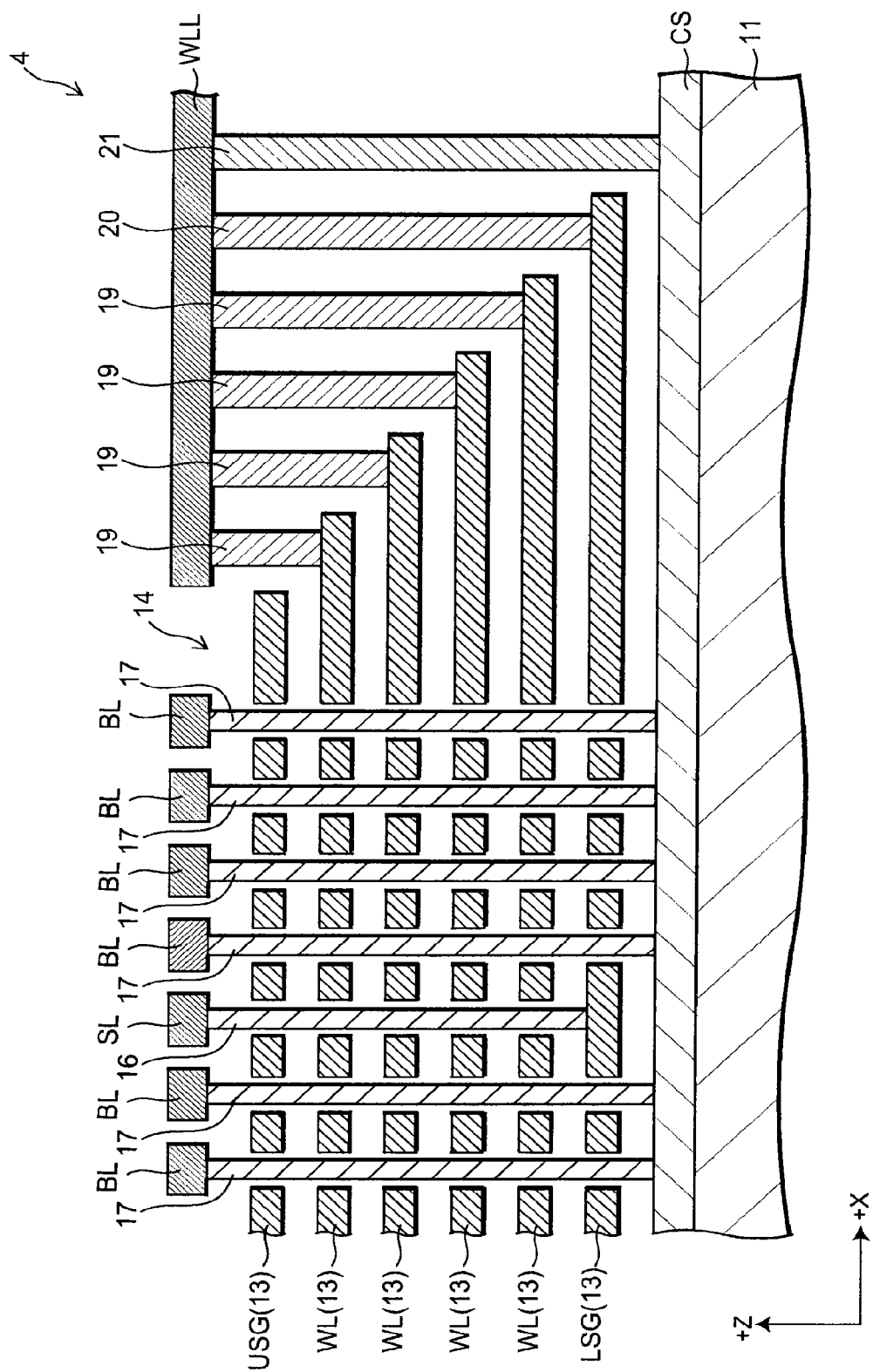
FIG. 9 is a cross-sectional view illustrating a nonvolatile semiconductor memory device according to a fourth embodiment of the invention.

FIG. 9 is a cross-sectional view illustrating a nonvolatile semiconductor memory device according to this embodiment.

As shown in FIG. 9, the nonvolatile semiconductor memory device 4 according to this embodiment is different from the nonvolatile semiconductor memory device 1 (see FIG. 3) according to the above first embodiment in that the conductor pillar 16 is connected not to the cell source CS, but to the lower select gate LSG. It is noted that the conductor pillar 16 is not connected to the upper select gate USG, the word lines WL, and the cell source CS. The configuration in this embodiment other than the foregoing is the same as that in the above first embodiment.

In this embodiment, the shunt interconnect SL is connected to the lower select gate LSG through the conductor pillar 16. Hence, the lower select gate interconnect LSL applies a potential to the end portion of the lower select gate LSG through the via 20, and also to the center portion of the lower select gate LSG through the shunt interconnect SL and the conductor pillar 16. Consequently, the potential of the lower select gate LSG can be rapidly adjusted.

The device 4 according to this embodiment can be illustratively manufactured by the following method. The first dielectric film 12 and the first electrode film 13 are formed. When through holes are formed in these films, no through hole is formed in the region which is to be immediately below the conductor pillar 16. Then, a semiconductor material is buried in the through holes. Next, the second and subsequent dielectric films 12 and electrode films 13 are formed. When through holes are formed in these films, the through holes 15 to be buried with conductor pillars 16 and the through holes 15 to be buried with semiconductor pillars 17 are simultaneously formed. Thus, the through holes 15 to be buried with semiconductor pillars 17 reach the cell source CS, but the through holes 15 to be buried with conductor pillars 16 extends only to the first electrode film 13, that is, the lower select gate LSG. Then, a semiconductor material is buried in all the through holes. Next, the uppermost dielectric film 12 and electrode film 13 are formed, through holes are formed, and a semiconductor material is buried. Thus, semiconductor pillars 17 are buried. Subsequently, the semiconductor material is removed from inside the through holes 15 to be buried with conductor pillars 16, and conductor pillars 16 are newly buried in these through holes 15. According to this method, the conductor pillars 16 can be provided only between the shunt interconnect SL and the lower select gate LSG.

Next, a fifth embodiment of the invention is described.

Figure 10:
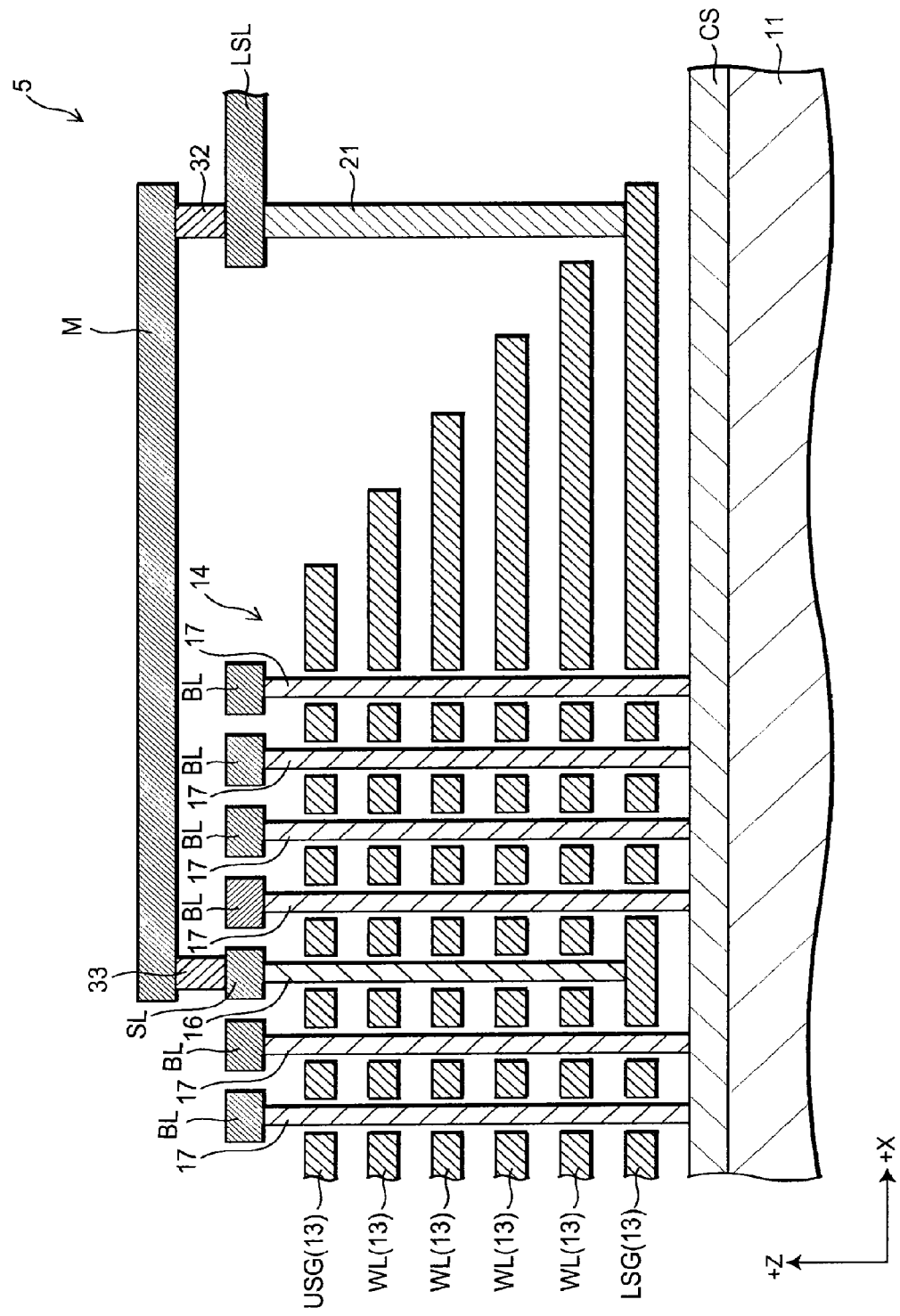
FIG. 10 is a cross-sectional view illustrating a nonvolatile semiconductor memory device according to a fifth embodiment of the invention.

FIG. 10 is a cross-sectional view illustrating a nonvolatile semiconductor memory device according to this embodiment.

As shown in FIG. 10, this embodiment is a combination of the above fourth embodiment and the above second embodiment. More specifically, in the nonvolatile semiconductor memory device 5 according to this embodiment, the shunt interconnect SL is connected to the lower select gate LSG through the conductor pillar 16, and an upper interconnect M is connected between the shunt interconnect SL and the lower select gate interconnect LSL. The configuration in this embodiment other than the foregoing is the same as that in the above fourth embodiment.

According to this embodiment, a potential can be applied to the lower select gate LSG through the shunt interconnect SL and the conductor pillar 16 without providing a driver circuit for driving the lower select gate LSG in the regions on the ±Y-direction side of the stacked body 14 and without routing an interconnect in these regions. The operation and effect in this embodiment other than the foregoing are the same as those in the above fourth embodiment.

Next, a sixth embodiment of the invention is described.

Figure 11:
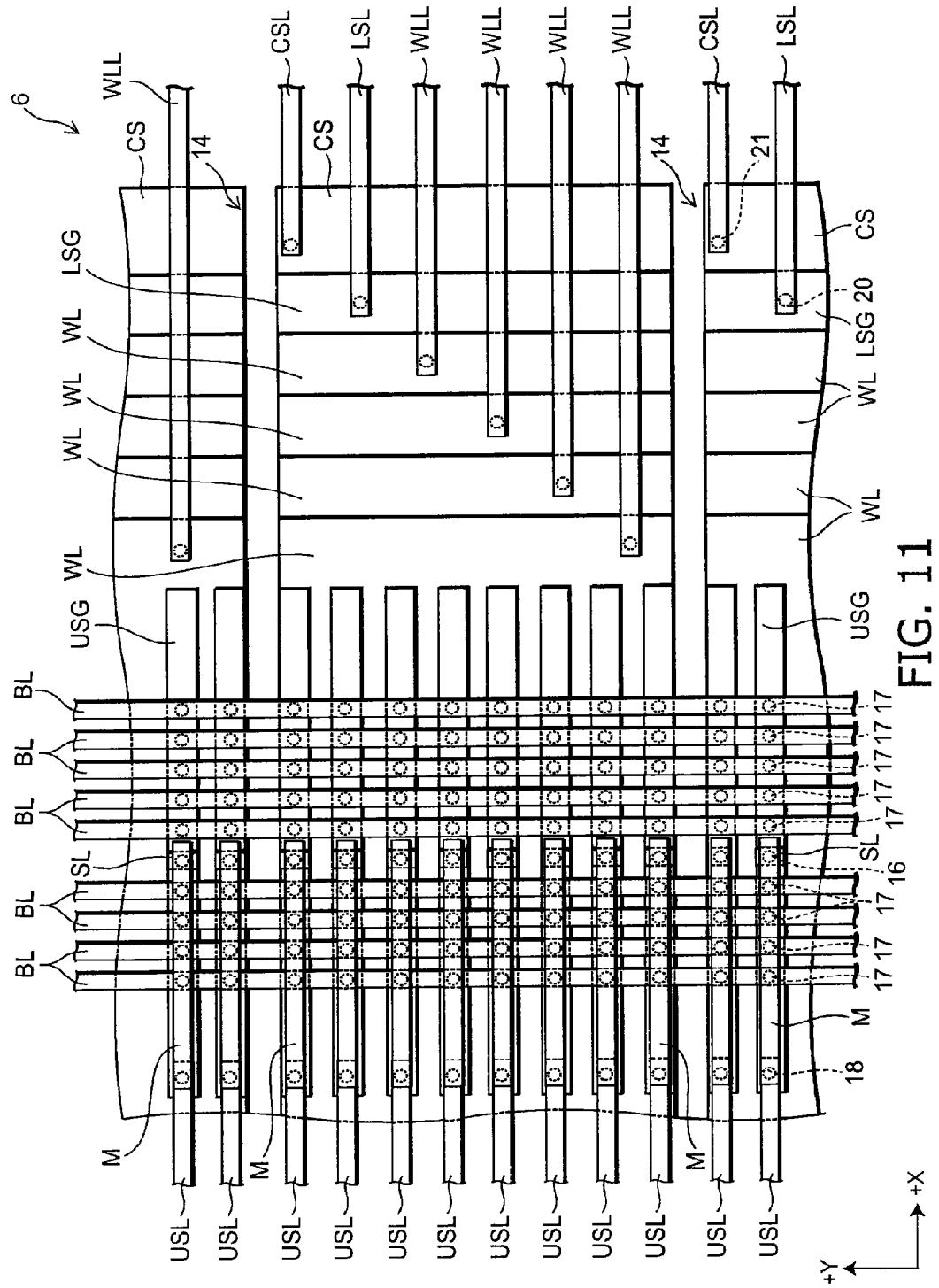
FIG. 11 is a plan view illustrating a nonvolatile semiconductor memory device according to a sixth embodiment of the invention.

FIG. 11 is a plan view illustrating a nonvolatile semiconductor memory device according to this embodiment.

Figure 12:
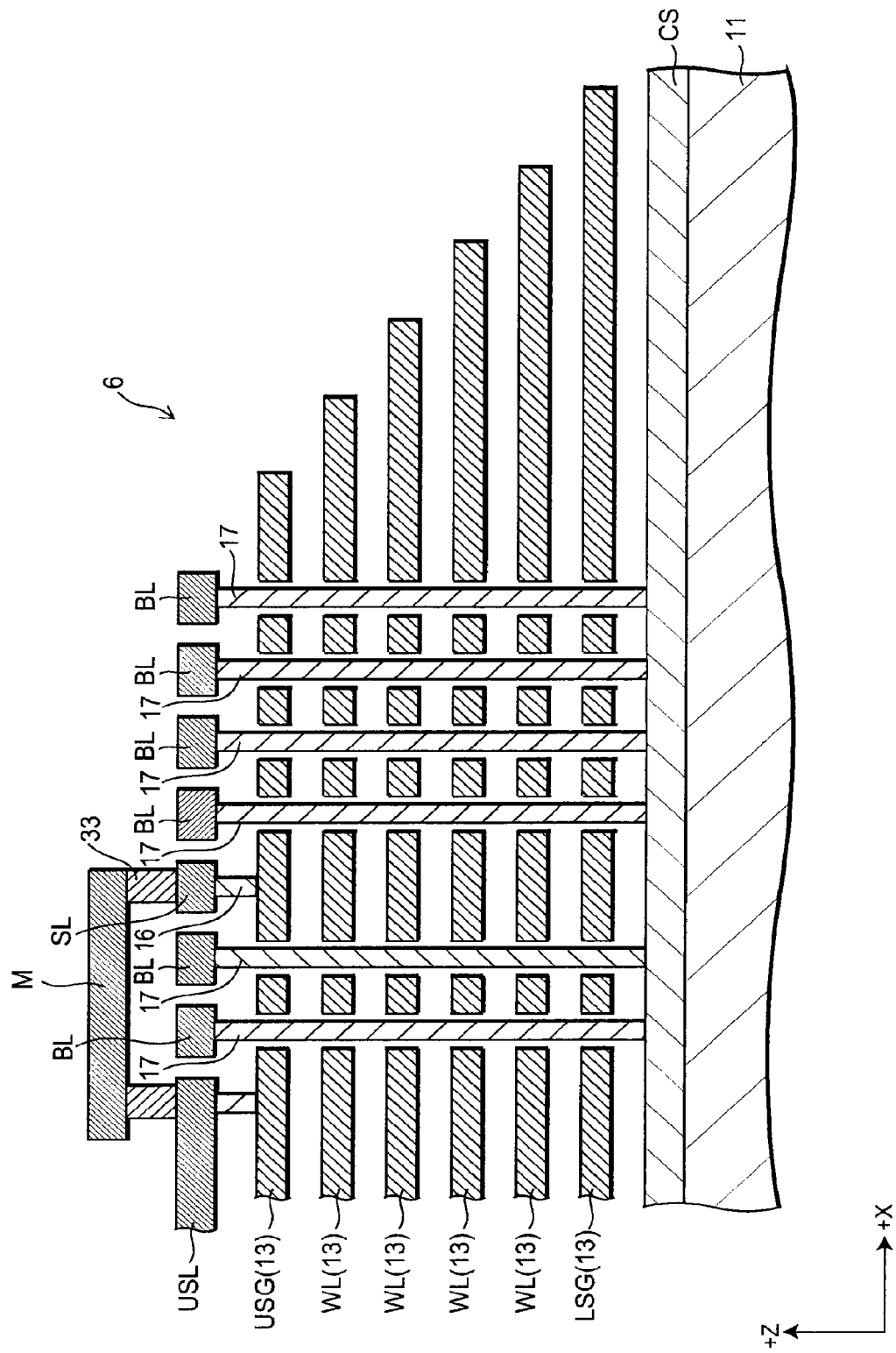
FIG. 12 is a cross-sectional view illustrating the nonvolatile semiconductor memory device according to the sixth embodiment.

FIG. 12 is a cross-sectional view illustrating the nonvolatile semiconductor memory device according to this embodiment.

As shown in FIGS. 11 and 12, the nonvolatile semiconductor memory device 6 according to this embodiment is different from the nonvolatile semiconductor memory device 2 (see FIGS. 6 and 7) according to the above second embodiment in the following points. The conductor pillar 16 is connected not to the cell source CS, but to the upper select gate USG. It is noted that the conductor pillar 16 is not connected to the word lines WL, the lower select gate LSG, and the cell source CS. Furthermore, the shunt interconnect SL is divided for each upper select gate interconnect USL. Moreover, the upper interconnect M is provided not for each stacked body 14, but for each upper select gate interconnect USL, and connects the upper select gate interconnect USL to the shunt interconnect SL. The configuration in this embodiment other than the foregoing is the same as that in the above second embodiment. The method for manufacturing the device 6 is similar to the method described in the above fourth embodiment.

In this embodiment, the upper select gate interconnect USL applies a potential to the end portion of the upper select gate USG through the via 18, and also to the center portion of the upper select gate USG through the upper interconnect M, the shunt interconnect SL, and the conductor pillar 16. Consequently, the potential of the upper select gate USG can be rapidly adjusted.

Next, a seventh embodiment of the invention is described.

Figure 13:
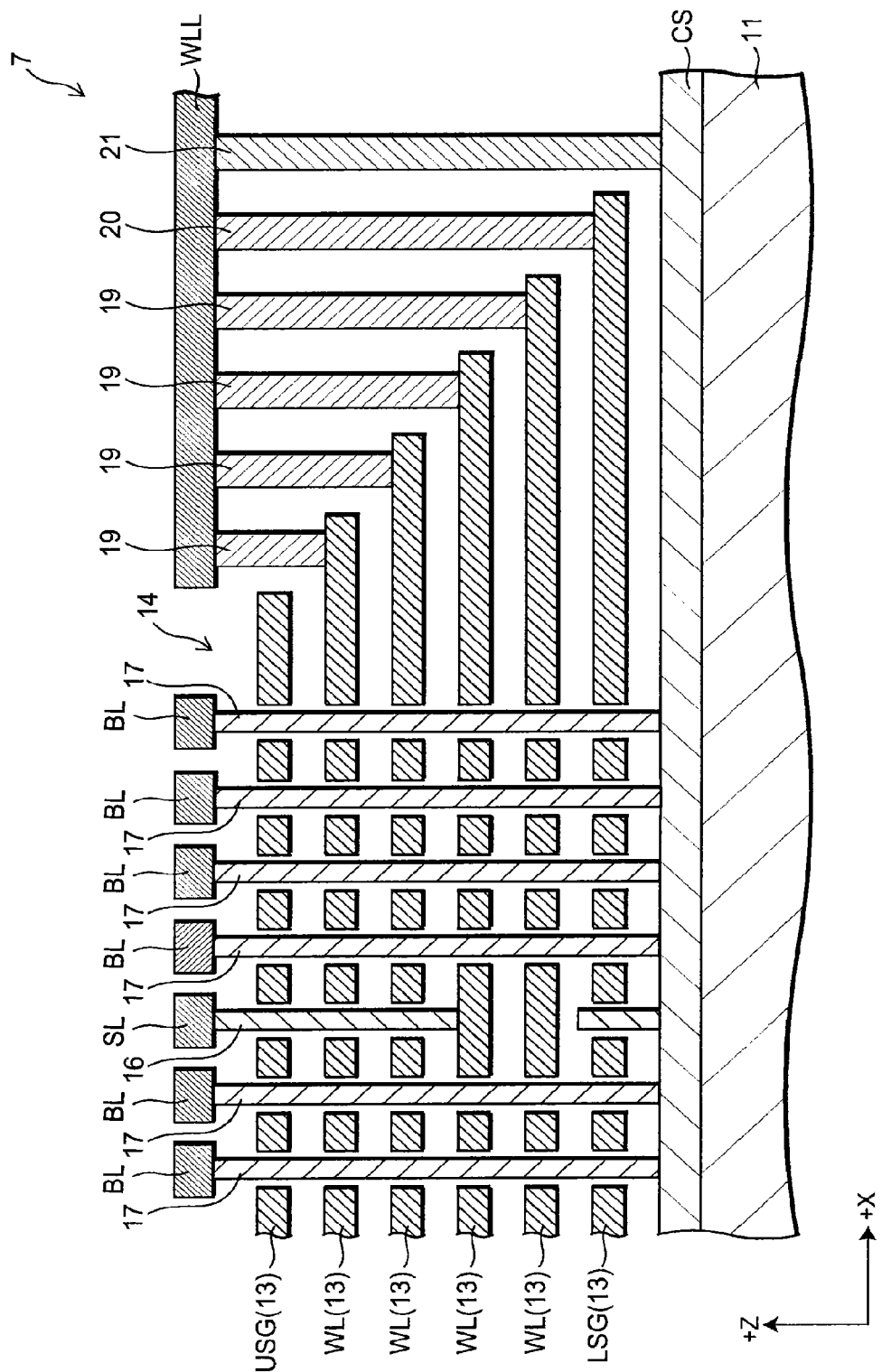
FIG. 13 is a cross-sectional view illustrating a nonvolatile semiconductor memory device according to a seventh embodiment of the invention.

FIG. 13 is a cross-sectional view illustrating a nonvolatile semiconductor memory device according to this embodiment.

As shown in FIG. 13, the nonvolatile semiconductor memory device 7 according to this embodiment is different from the nonvolatile semiconductor memory device 1 (see FIG. 3) according to the above first embodiment in that the conductor pillar 16 is connected not to the cell source CS, but to one of the word lines WL. It is noted that the conductor pillar 16 is not connected to the upper select gate USG, the other word lines WL, the lower select gate LSG, and the cell source CS. The configuration in this embodiment other than the foregoing is the same as that in the above first embodiment.

It is noted that immediately below the conductor pillar 16, the through hole may be formed or omitted. In the case where the through hole is formed, a dielectric material may be buried in this through hole, or a conductive or semiconductor material may be buried therein as long as it is not connected to the conductor pillar 16 thereabove. Even if the semiconductor material is buried therein, it does not serve as a memory cell.

In this embodiment, the word interconnect WLL applies a potential to the +X-direction end portion of the word line WL through the via 19, and also to the X-direction center portion of the word line WL through the shunt interconnect SL and the conductor pillar 16. Consequently, the potential of this word line WL can be rapidly adjusted.

Next, an eighth embodiment of the invention is described.

Figure 14:
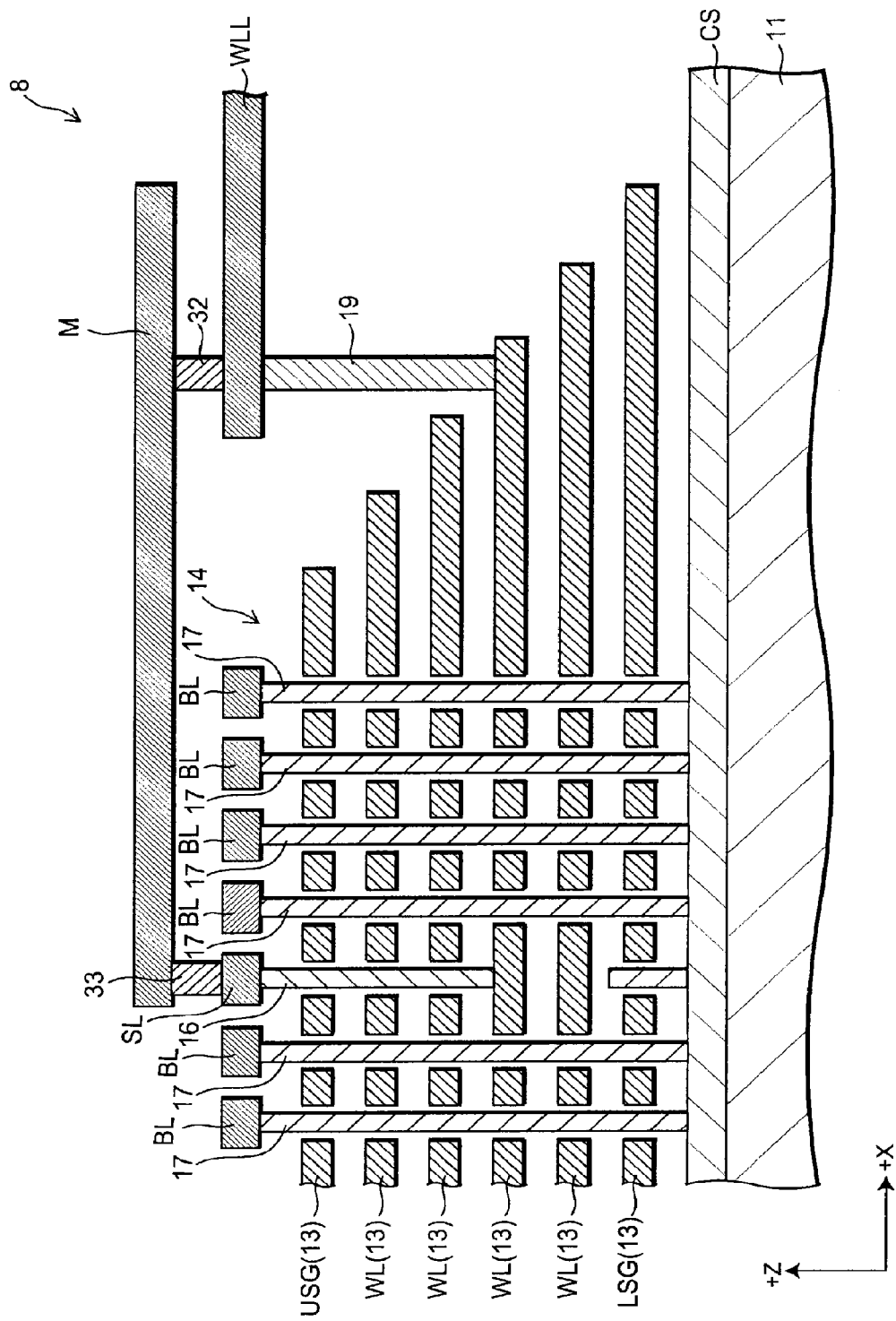
FIG. 14 is a cross-sectional view illustrating a nonvolatile semiconductor memory device according to an eighth embodiment of the invention.

FIG. 14 is a cross-sectional view illustrating a nonvolatile semiconductor memory device according to this embodiment.

As shown in FIG. 14, this embodiment is a combination of the above seventh embodiment and the above second embodiment. More specifically, in the nonvolatile semiconductor memory device 8 according to this embodiment, the shunt interconnect SL is connected to one of the word lines WL through the conductor pillar 16, and an upper interconnect M is connected between the shunt interconnect SL and the word interconnect WLL connected to this word line WL. The configuration in this embodiment other than the foregoing is the same as that in the above seventh embodiment.

According to this embodiment, a potential can be applied to the word line WL through the shunt interconnect SL and the conductor pillar 16 without providing a driver circuit for driving the word line WL in the regions on the ±Y-direction side of the stacked body 14 and without routing an interconnect in these regions. The operation and effect in this embodiment other than the foregoing are the same as those in the above seventh embodiment.

The invention has been described with reference to the embodiments. However, the invention is not limited to these embodiments. For example, the above embodiments can be practiced in combination with each other. Furthermore, those skilled in the art can suitably modify the above embodiments by addition, deletion, or design change of the components, and such modifications are also encompassed within the scope of the invention as long as they fall within the spirit of the invention.

The invention claimed is:

1. A nonvolatile semiconductor memory device comprising, within a memory cell array:
   a plurality of electrode films which are respectively stacked separately,
   a semiconductor member extending in a stacking direction, the plurality of the electrode films formed on opposite sides of the semiconductor member;
   an electrically conductive conductor member having a lower resistivity than that of the semiconductor member, the conductor member extending in the stacking direction, the plurality of the electrode films formed on opposite sides of the conductor member;

a first line provided above the plurality of the electrode films, the first line being electrically connected to the semiconductor member;

a first interconnect, separate from the first line, provided above the plurality of the electrode films, the first interconnect being electrically connected to the conductor member;

a charge storage layer provided between the semiconductor member and one of the electrode films; and a dielectric layer provided between the conductor member and the plurality of electrode films.

2. The memory device according to claim 1, further comprising a second interconnect provided below the plurality of the electrode films, the conductor member being electrically connected to the second interconnect.

3. The memory device according to claim 2, wherein the first line is a bit line, and the second interconnect is a source line.

4. The memory device according to claim 2, wherein a first distance between the first line and the second interconnect is substantially the same as a second distance between the first interconnect and the second interconnect.

5. The memory device according to claim 2, further comprising:

an additional conductor member extending in the stacking direction, the additional conductor member being electrically connected to the second interconnect, the plurality of the electrode films formed on opposite sides of the additional conductor member; and an additional dielectric layer provided between the additional conductor member and the plurality of electrode films.

6. The memory device according to claim 5, wherein the conductor member and the additional conductor member are arranged in a first direction, and the first line extends in the first direction.

7. The memory device according to claim 1, wherein both of the first line and the first interconnect extend in a first direction.

* * * * *